United States Patent [19]

Garnache et al.

[11] 4,364,074
[45] Dec. 14, 1982

[54] V-MOS DEVICE WITH SELF-ALIGNED MULTIPLE ELECTRODES

[75] Inventors: Richard R. Garnache, South Burlington; Donald M. Kenney, Shelburne, both of Vt.; Nandor G. Thoma, Boca Raton, Fla.

[73] Assignee: International Business Machines Corporation, Armonk, N.Y.

[21] Appl. No.: 158,668

[22] Filed: Jun. 12, 1980

[51] Int. Cl.³ .............................................. H01L 29/78
[52] U.S. Cl. ...................................... 357/23; 357/41; 357/55
[58] Field of Search ...................... 357/23 VD, 55, 41

[56] References Cited

U.S. PATENT DOCUMENTS

| | | | |
|---|---|---|---|
| 3,975,221 | 8/1976 | Rodgers | 357/23 VD |
| 4,105,475 | 8/1978 | Jenne | 357/23 VD |
| 4,225,879 | 9/1980 | Vinson | 357/23 VD |
| 4,250,519 | 2/1981 | Mogi | 357/55 X |
| 4,316,203 | 2/1982 | Tohgei | 357/23 VD |

*Primary Examiner*—Martin H. Edlow
*Attorney, Agent, or Firm*—Howard J. Walter, Jr.

[57] ABSTRACT

High density VMOSFET devices, particularly single transistor memory cells, are provided by use of a series of simplified self-aligning process steps. Gate electrodes, source/drain regions and source/drain contacts are provided with the aid of an initial mask-less photoresist removal process in which a relatively thick layer of self-leveling photoresist is uniformly removed in order to define portions of a gate electrode within the recess of a V-groove. The gate electrode subsequently acts as a self-aligned mask to define implanted source/drain regions also within the V-groove and to enable second level interconnecting metallurgy contacts to be formed along the sidewalls of the V-groove.

6 Claims, 12 Drawing Figures

V-MOS DEVICE WITH SELF-ALIGNED MULTIPLE ELECTRODES

BACKGROUND OF THE INVENTION

1. Field of the Invention

This invention relates to semiconductor devices, and more particularly to device structures and methods for providing self-aligned contacts for semiconductor devices having vertical structural features such as V-groove metal oxide semiconductor (V-MOS) devices.

2. Description of the Prior Art

In the art of semiconductor manufacturing the cost of semiconductor devices is directly related to the number of devices, and their related functions, which can be placed on a single semiconductor chip and also to the number and complexity of the manufacturing steps necessary to fabricate devices.

In the past, efforts to increase device density have been somewhat limited by photolithographic dimensional limitations. Recently, however, techniques have become available which enable dimensions of less than one micron to be used in photolithographic processing. Interest has also recently turned to the application of vertically integrated device structures. For example, the article "Grooves add new dimension to V-MOS structure and performance," by F. B. Jenne, *Electronics*, Aug. 18, 1977, pp. 100–106, discusses some aspects of V-MOS technology and illustrates various techniques for increasing effective device density through the use of V-MOS technology.

Semiconductor processing techniques which reduce the number of processing steps and/or their complexity are also useful to lower the cost of semiconductor devices by increasing product yield or by increasing density, when the number of critical mask alignment steps can be reduced. Thus, manufacturing processes which provide a high degree of self-aligning elements, i.e., process steps which do not require the alignment and associated alignment tolerances of photolithographic masks, can indirectly aid in the reduction of the cost of semiconductor devices.

Prior art techniques which use vertical processing in combination with self-aligning process steps include the following references.

The article, "VMOS ROM," by T. J. Rodgers et al, IEEE J. Solid-State Circuits, vol. SC-11, No. 5, October 1976, pp. 614–622, teaches a self-aligning diffusion technique at page 619 for ensuring diffused bit line conductivity around a V-grooved etched MOSFET. A single masking oxide layer is used for the diffusion and V-etch mask.

U.S. Pat. No. 4,065,783 to Ouyang uses a similar masking technique to define an ion-implanted MOSFET channel region and a V-groove etched structure.

U.S. Pat. No. 4,116,720 to Vinson uses a similar technique to define both a V-groove and a buried ion-implanted storage node for a dynamic memory cell.

The article, "Optimization of Nonplanar Power MOS Transistors," by K. P. Lisiak et al, IEEE Tr. Electron Devices, vol. ED-25, No. 10, October 1978, pp. 1229-34, teaches in FIG. 7 (d) a fully self-aligned VMOS vertical channel power transistor, but does not suggest the method by which such a device can be fabricated.

Copending U.S. patent application "Method for Providing Self-Aligned Conductor in a V-Groove Device," R. R. Garnache et al, Ser. No. 103,981 and filed Dec. 17, 1979, is also pertinent as it teaches a photolithographic masking technique for providing a self-aligned electrode formed at least partially within a V-groove on the surface of a semiconductor.

U.S. Pat. No. 4,003,036 to Jenne describes a VMOS single FET/capacitor memory cell of the type to which the preferred embodiment of the invention described here has been applied.

SUMMARY OF THE INVENTION

Accordingly, it is an object of this invention to provide increased density of integrated circuits manufactured in V-groove technology.

A more specific object is to provide improvements in self-aligned electrodes for use in V-MOS devices, particularly dynamic memory cells.

Briefly, these objects are accomplished through the use of the self-aligned electrode forming process, as described in above-identified U.S. application 103,981, in combination with additional substantially self-aligning processing steps used to form self-aligned gate, source/drain regions and contact metallurgy to provide a high density self-aligned MOSFET memory cell which includes a contact structure formed below the surface of a semiconductor substrate which imposes no additional penalty on device density.

These and other objects, features and advantages of the invention will be apparent from the following more particular description of the preferred embodiments of the invention, as illustrated in the accompanying drawings.

DESCRIPTION OF THE PREFERRED EMBODIMENT

Figure 1:
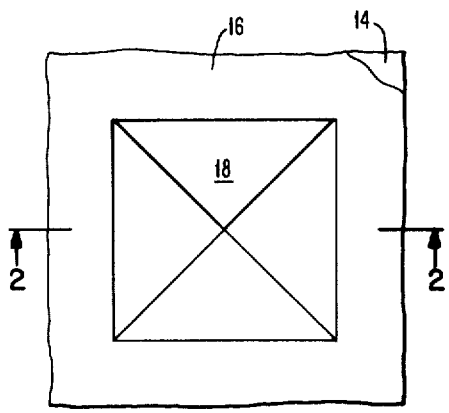
FIGS. 1–12 are plan and sectional views of a semiconductor substrate at various stages of processing in accordance with the invention to form a single FET-capacitor memory cell in which the gate, source/drain regions and contact metallurgy are formed by self-aligning processing techniques.
Figure 2:
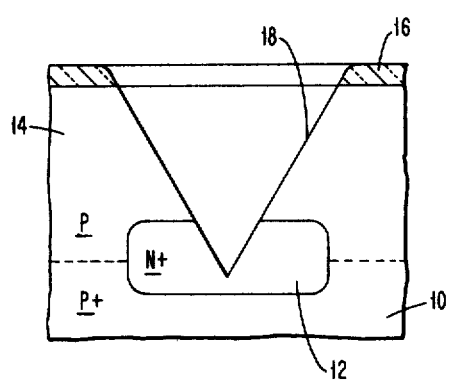

Referring to FIGS. 1 and 2 there is shown a partially processed VMOS memory device, generally as taught in U.S. Pat. No. 4,003,036 to Jenne, in which there is provided a P+ semiconductor substrate 10, for example, silicon, including a buried N+ region 12 and an P-type epitaxial semiconductor layer 14. Buried region 12 will subsequently act as a charge storage node for the single FET-capacitor memory cell to be formed in the semiconductor substrate. Those skilled in the art will recognize that epitaxial layer 14 may include gradations of p-type impurity concentration in order to control the capacitive characteristics of region 12 and/or to control the conduction characteristics of the MOSFET to be subsequently formed. After formation of epitaxial layer 14, a masking layer 16, preferably of thermally grown silicon dioxide, is provided. Masking layer 16 is about 5000–6000 angstroms in thickness so that it can act as a field oxide for devices to be formed. By well known photolithographic masking and etching techniques a number of square holes are formed in layer 16. Although only a single hole is shown, it will be understood that an array or matrix of holes are required to form a plurality of memory cells. The exact spacing between holes in layer 16 depends on a number of factors including minimum permissible line widths allowable in the particular process technology in which the semiconductor devices are being implemented. After providing masking layer 16, an anisotropic etchant such as a hydrazine-water solution is used to etch self-terminating V-shaped pits 18. Provided that a 100 oriented silicon substrate 10 is used anisotropic etching will provide pyramidal-shaped etch pits limited at the side-walls by 111 surfaces. Reference to the article "Optimization of the Hydrazine-Water Solution for Anisotropic Etching of Silicon in Integrated Circuit Technology," M. J. Declercq et al *J. Electro-Chem. Soc.*, April 1975, pages 545-552, will provide more detailed information on anisotropic etching of silicon. Since it is desirable for etch pit 18 to intersect buried region 12, the thickness of layer 14 and the size of the holes in layer 16 require a predetermined relationship. Following the etching of pits 18 a dip etch may be used to remove portions of layer 16 which may extend beyond the top edges of etch pit 18.

Figure 3:
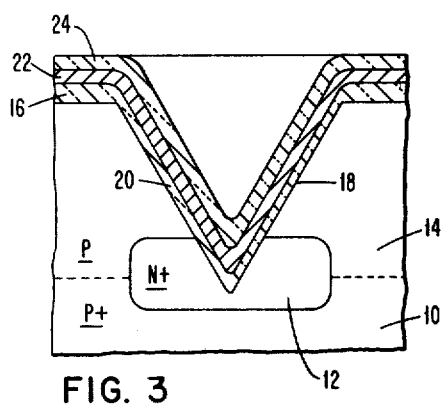

Next, referring to FIG. 3, a dielectric layer 20 suitable for a gate oxide, for example silicon dioxide of about 500 angstroms may be grown or deposited on the exposed silicon surfaces of etch pit 18. A layer of conductive material 22 suitable for a gate electrode is blanket deposited over the dielectric layers 16 and 20. The thickness of layer 22 will depend upon the particular material used which may be a silicide, such as tungsten silicide, polysilicon or a refractory metal, such as molybdenum. Following deposition of layer 22, a passivating layer 24 is provided, which is preferred to be a phosphorous doped oxide because of its ability to flow under heat treatment. See U.S. Pat. No. 3,825,442 to Moore for examples of suitable materials.

Figure 4:
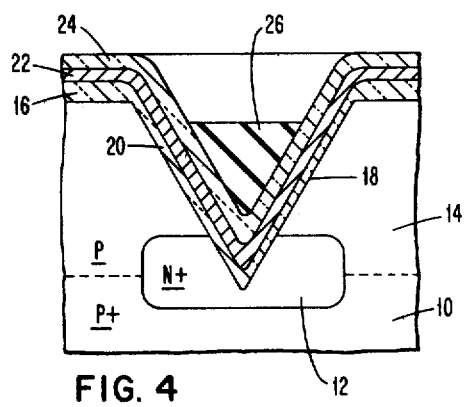

Next, as shown in FIG. 4, a self-leveling photoresist layer is provided over layer 24 and a self-aligned photoresist mask is formed as taught in U.S. patent application Ser. No. 103,981 to R. R. Garnache et al filed Dec. 17, 1979. Briefly, this process includes the steps of depositing a layer of masking material over the substrate which completely fills etch pit 18 and provides a planar upper surface. A controllable directional etching technique is then used to uniformly remove the top portion of the photoresist layer until a self-aligned plug 26 remains in etch pit 18. The amount of photoresist retained in pit 18 should have its upper surface sufficiently below the original top surface of layer 14 to enable the formation of a source or drain region and its associated contact to be formed, as described below, on the side walls of etch pit 18.

Figure 5:
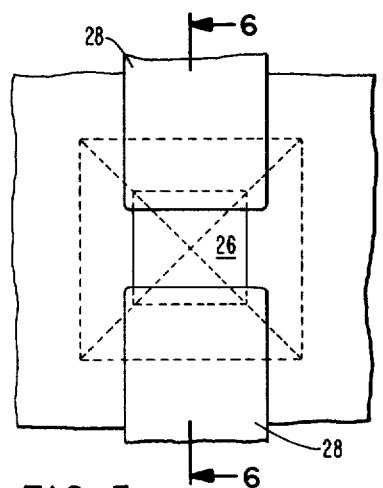
Figure 6:
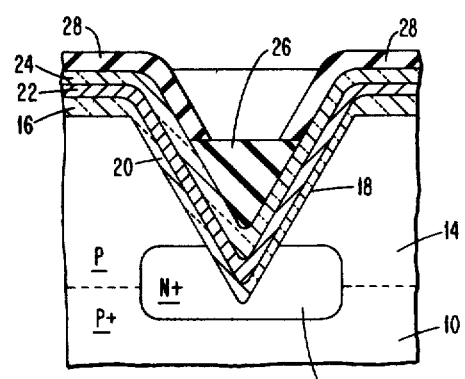

After formation of photoresist plug 26 a second photoresist masking layer is deposited, exposed and developed to protect those portions of layers 22 and 24 which will be used to form the gate electrodes subsequently to become the word access lines in the memory array to be provided. In FIGS. 5 and 6 there is shown second photoresist layer 28 overlying a portion of layer 24 and plug 26. The positioning of the mask for defining photoresist layer 28 is not critical as long as a portion overlaps both sides of photoresist plug 26, as shown in FIGS. 5 and 6.

Figure 7:
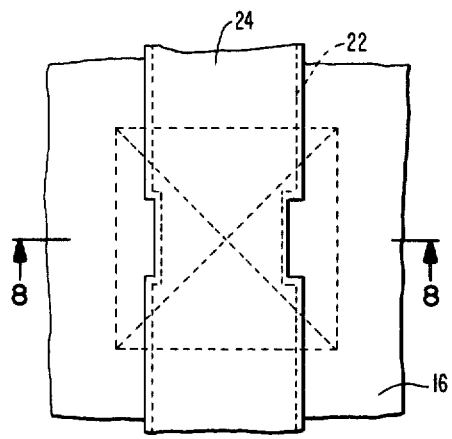
Figure 8:
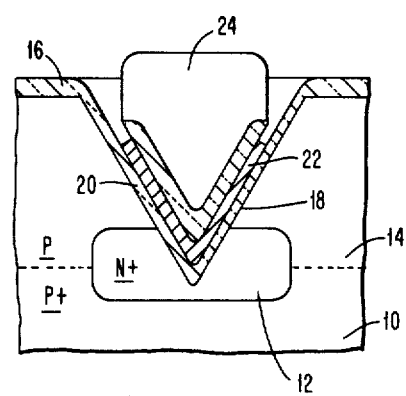

Following definition of photoresist layer 28, exposed portions of layers 24 and 22 are removed by etching by any convient technique. A selective etchant for conductive layer 22 is used in order to provide an overhanging portion at the exposed edges of insulator layer 24 as shown in FIGS. 7 and 8. This step is particularly important if conductive layer 22 is formed from a molybdenum, silicide or other conductive material not readily oxidizable or self-passivating. Next, the substrate is subjected to a heating step, as taught in the above identified patent of Moore, to cause phosphorous doped oxide layer 24 to flow over the exposed edges of conductive layer 22. If high conductivity of conductive layer 22 is not an important consideration, polysilicon may be used as layer 22 and the above steps of providing an overhang and heating can be substituted by an oxidation step provided that a process is used which will enable the growth of a significant thickness of passivating oxide on layer 22 while not significantly increasing the thickness of exposed gate oxide 20. See, for example, the process described in the article, "Low Temperature Oxidation Method for Self-Passivating of Polysilicon Conductors During Gate Oxide Growth," R. Silverman et al, *IBM Technical Disclosure Bulletin*, August 1979, page 935.

Figure 9:
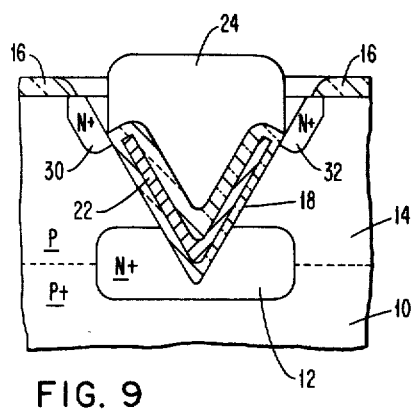

Following the passivation of conductive layer 22, self-aligned N+ regions 30 and 32 are formed using both the passivated gate electrode 22 and thick oxide 16 as a mask. A preferred technique is to strip exposed portions of gate oxide layer 20 from the top edges of etch pit 18 either prior to or after ion implanting n-type impurities into layer 14 to form regions 30 and 32, as shown in FIG. 9, which act as bit line contacts to the memory cell. It should be noted that the surface area of regions 30 and 32 are all substantially formed within the initially formed etch pit 18 and do not consume any lateral surface area of the substrate, thus allowing maximum density of memory cells to be formed.

Figure 10:
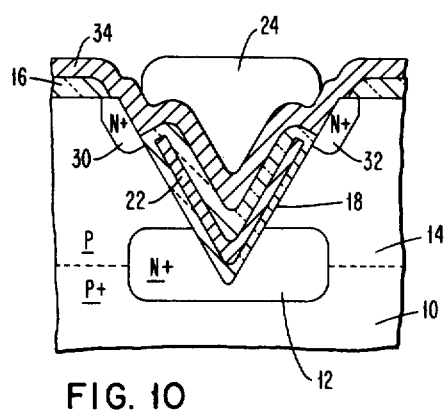
Figure 11:
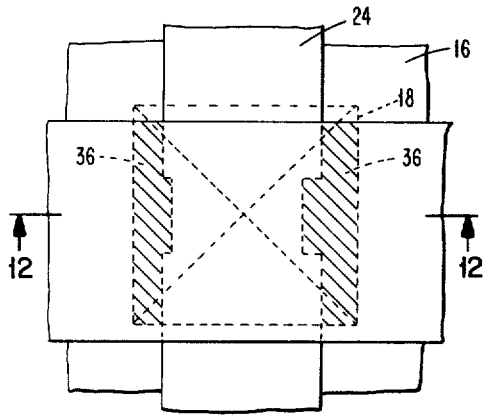
Figure 12:
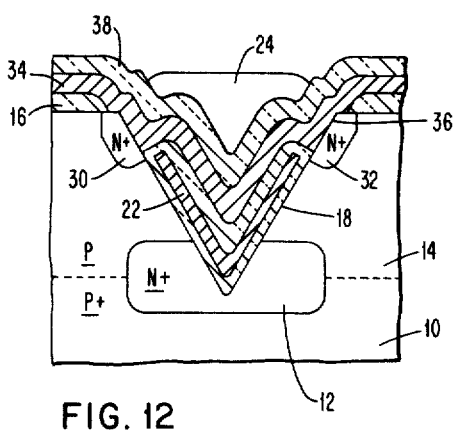

After the formation of regions 30 and 32, a second layer of conductive material is deposited and defined to form interconnecting metallurgy for the bit lines of the memory array. For example, a layer 34 of conductive aluminum, polysilicon or silicide may be deposited as shown in FIG. 10. Layer 34 makes self-aligned ohmic contact with the semiconductor substrate only at regions 30 and 32, which in turn were also formed in a self-aligned manner. When second conductive layer 34 is defined, photolithographic alignment tolerances are not critical as can be seen in FIG. 11 which illustrates vertical misalignment between bit line conductor 34 and etch pit 18. Contacts between bit line 34 and doped regions 30 and 32 are illustrated as shading lines 36. Depending upon the particular conductive material used for bit line 34, several techniques are suitable. For example, if bit line 34 is chosen to be polysilicon or other self-passivating material a dielectric layer such as oxidized polysilicon may be used as a passivation layer. If bit line 34 is not self-passivating, the phosphorous doped oxide-reflow technique described above in connection with the formation of word line 22 may also be used. FIG. 12 is a sectional view of a completed memory cell after the formation of a dielectric passivation layer 38 over bit line 34.

Additional processing steps relating to the formation of support circuitry in non-array areas of the semiconductor substrate may be included either simultaneously with the steps of the above process or may be included subsequently to these steps. For example, the conductive layer used to form gate or word line 22 may be used appropriately in support areas which may or may not utilize VMOS processing.

In summary, there has been described a process for providing very compact FET devices, particularly a memory cell including a VMOS FET and a capacitor, in which a self-aligned etching technique is used to define at least some of the dimensions of a first conductive layer within a surface recess which in turn acts as a self-aligned mask for the formation of self-aligned substrate contact regions also formed substantially within the same surface recess.

Those skilled in the art will recognize that various MOSFET device structures in addition to the described memory cell can be fabricated using the above process, either by the substitution or elimination of certain of the individual process steps. For example, a planar VMOS FET can be made by omitting the initial steps which provide buried region 12. A vertical VMOSFET can be made by providing a contact between buried region 12 and either the top or bottom surface of the semiconductor substrate. Buried region 12 and P-type layer 14 may also be formed entirely by ion implantation techniques, thus eliminating the requirement for the use of epitaxial deposition process. See, for example, U.S. Pat. Nos. 4,116,720 to Vinson and 4,194,283 to Hoffmann.

While the invention has been described with respect to an anisotropic etched V-groove etch pit provided by a square-shaped mask, other rectangular or more complex shapes may be used for the anisotropic etch mask. Semiconductor surface recess shapes other than anisotropic etched V-grooves may also be used. For example, a U-shaped or square recess such as described in the above identified patent application Ser. No. 103,981 may also be used. Such vertical sidewall recesses may be formed by wet etching including anisotropic etching, or by other directionally dependent etching such as sputtering or reaction ion etching.

What is claimed is:

1. A semiconductor device comprising;
   a semiconductor substrate having at least one recess provided in a surface thereof;
   a first dielectrically insulated conductive layer on said substrate having at least a portion of which extends into said recess, said first conductive layer having at least a portion of at least one edge thereof terminating within said recess below the level of the surface of said substrate, and
   a second conductive layer overlying at least a portion of said first conductive layer which extends into said recess, said second conductive layer making physical contact to said substrate within said recess below the level of the surface of said substrate.

2. The semiconductor device of claim 1 wherein said semiconductor substrate is of a first conductivity type and wherein at least one first region of second conductivity type is provided in said recess below the level of the surface of said substrate which is contacted by said second conductive layer.

3. The semiconductor device of claim 2 further including a second region of second conductivity type provided in said recess said second region being spaced from said first region and lying below said portion of said first conductive layer which extends into said recess.

4. The semiconductor device of claim 3 wherein said recess is V-shaped.

5. A V-MOSFET semiconductor memory cell comprising;
   a semiconductor substrate of a first conductivity type having a V-shaped recess formed in a first surface thereof;
   a charge storage region formed in said substrate in contact with the apex of said V-shaped recess;
   a first dielectrically insulated conductive word line electrode passing over said recess and having two parallel edges thereof being defined within said recess below said first surface of said substrate;
   first and second regions of second conductivity type formed in said recess, said regions being substantially defined by the surfaces of said V-shaped recess at their intersection with said first surface of said substrate and by a respective edge of said word line electrode; and
   a conductive bit line electrode substantially orthogonal to said word line electrode, said bit line electrode passing over said word line electrode and making contact to both of said first and second regions of second conductivity type within said recess below said surface of said substrate.

6. The V-MOSFET semiconductor memory cell of claim 5 wherein said charge storage region comprises a third region of second conductivity type.

* * * * *